United States Patent [19]

Dodd et al.

[11] Patent Number: 5,196,053
[45] Date of Patent: Mar. 23, 1993

[54] COMPLEXING AGENT FOR DISPLACEMENT TIN PLATING

[75] Inventors: John R. Dodd; Anthony J. Arduengo, III; Randal D. King, all of Wilmington, Del.; Americus C. Vitale, West Chester, Pa.

[73] Assignee: McGean-Rohco, Inc., Cleveland, Ohio

[21] Appl. No.: 799,136

[22] Filed: Nov. 27, 1991

[51] Int. Cl.$^5$ .................. C23C 18/31; B05D 5/12
[52] U.S. Cl. .................. 106/1.22; 106/1.23; 106/1.24; 106/1.25; 106/1.26; 106/1.27; 106/1.28; 106/1.29; 427/98; 427/437; 427/443.1
[58] Field of Search .......... 106/1.22, 1.23, 1.24, 106/1.25, 1.26, 1.27, 1.28, 1.29; 427/98, 437, 443.1

[56] References Cited

U.S. PATENT DOCUMENTS

| | | | |
|---|---|---|---|
| 2,891,871 | 6/1959 | Ceresa et al. | 106/1.25 |
| 3,303,029 | 2/1967 | Shipley | 106/1.25 |
| 3,736,157 | 5/1973 | Hacias | 106/1.22 |
| 3,917,486 | 11/1975 | Schneble, Jr. | 106/1.25 |
| 3,971,861 | 7/1976 | de Waltoff | 106/1.22 |
| 4,027,055 | 5/1977 | Schneble, Jr. | 106/1.25 |
| 4,194,913 | 3/1980 | Davis | 106/1.22 |
| 4,263,106 | 4/1981 | Kohl | 205/303 |
| 4,301,196 | 11/1981 | McCormack et al. | 106/1.23 |
| 4,368,223 | 1/1983 | Kobayashi et al. | 106/1.22 |
| 4,486,233 | 12/1984 | Josso et al. | 106/1.22 |
| 4,582,576 | 4/1986 | Opaskar et al. | 106/1.22 |
| 4,657,632 | 4/1987 | Holtzman et al. | 427/437 |
| 4,715,894 | 12/1987 | Holtzman et al. | 106/1.22 |
| 4,749,626 | 6/1988 | Kadija et al. | 106/1.22 |
| 4,816,070 | 3/1989 | Holtzman et al. | 106/1.25 |
| 4,882,202 | 11/1989 | Holtzman et al. | 106/1.22 |
| 5,135,574 | 8/1992 | Konishi et al. | 106/1.22 |
| 5,143,544 | 9/1992 | Iantosca | 106/1.22 |

Primary Examiner—Mark L. Bell
Assistant Examiner—Helene Klemanski
Attorney, Agent, or Firm—William P. Hauser; James A. Lucas

[57] ABSTRACT

An environmentally innocuous effective replacement for thiourea is disclosed for use as a complexing agent in displacement plating processes in which the plating solution is applied to the substrate surface to be plated by immersion or by spraying, cascading, pouring and the like. The replacement complexing agent is an imidazole-2-thione compound having the formula:

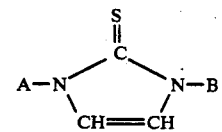

wherein A and B are the same or different —R—Y groups, wherein R is linear, branched or cyclic alkenyl group containing 1 to 12 carbon atoms and Y is a hydrogen, halogen, cyano, vinyl, phenyl, or ether moiety. Of this class of compounds, 1-methyl-3-propyl-imidazole-2-thione is preferred for immersion tin plating. This class of complexing agents is particularly useful in spray displacement tin plating for the manufacture of printed circuit boards wherein free tin metal is added to the plating solution.

31 Claims, No Drawings

COMPLEXING AGENT FOR DISPLACEMENT TIN PLATING

BACKGROUND OF THE INVENTION

This invention relates to the chemical displacement plating. More particularly, this invention relates to plating of tin on copper, copper alloys, and other metals by chemical displacement using an immersion, a spray, a flood or a cascade application process. Still more particularly, this invention relates to the use of such chemical displacement plating in the manufacture of printed circuit boards.

Coatings of tin typically have been applied to surfaces of copper and copper based alloys by a particular mode of displacement plating, i.e., immersion plating techniques such as disclosed in U.S. Pat. No. 2,891,871, U.S. Pat. No. 3,303,029, U.S. Pat. No. 4,657,632 and U.S. Pat. No. 4,715,894. ("Displacement" plating has also been referred to as "replacement" plating and for the purpose of this invention the terms are intended to be synonymous.) In the disclosed immersion tin plating techniques, a bath is prepared containing an aqueous solution of a tin(II) salt, an acid, and thiourea or a thiourea derivative as essential ingredients. In the immersion tin plating process, an article bearing a copper surface, e.g., a copper clad printed circuit board, is immersed in the plating bath for a period of time during which the surface copper metal is oxidized to cuprous ion and complexed with the thiourea and is replaced at the surface by the concurrently reduced tin metal from the tin(II) ion. After displacement plating has been completed to a desired thickness, the article is removed from the bath and is rinsed to remove residual plating solution. During the plating process the concentration of cuprous thiourea complex in the immersion bath increases. Likewise, some aerial oxidation of tin(II) ion leads to increased tin(IV) ion concentration during the life of the plating bath. However, the concentrations of cuprous complex and tin(IV) ion rapidly equilibrate due to the substantial drag-out of the plating solution with the plated article and the subsequent bath replenishment. The presence of tin(IV) ion in tin displacement plating is undesirable since it reduces the efficiency of the plating bath. Immersion plating baths typically have a very small surface-to-volume ratio which minimizes aerial oxidation and typically the equilibrium concentration of tin(IV) ion is within acceptable limits. Nevertheless, when plated surface thickness is critical, as in some printed circuit board applications, undesirable aerial oxidation during removal of the article from the immersion bath can result in streaks of non-uniform thickness in the plated surface.

Chemical displacement plating has been used in the manufacture of printed circuit boards (PCB's) and particularly multilayer printed circuit boards. Printed circuit boards (PCB's) comprise a non-conducting or dielectric such as a fiberglass/epoxy sheet which is clad with a metal conductive layer such as copper on either one or both surfaces. The metal layer on the PCB before processing typically is a continuous layer of copper which may be interrupted by a pattern of plated through holes or vias linking both surfaces of the board. During processing selected portions of the copper layer are removed to form a raised copper circuit image pattern of the PCB. Multilayer PCB's are typically constructed by interleaving imaged conductive layers such as one containing copper with dielectric adhesive layers such as a partially cured B-stage resin, i.e., a prepreg, into a multilayer sandwich which is then bonded together by applying heat and pressure. Production of these types of printed circuit boards are described in "Printed Circuits Handbook", Third Edition, edited by C. F. Coombs, Jr., McGraw-Hill, 1988, which is incorporated herein by reference. Since a conductive layer with a smooth copper surface does not bond well to the prepreg, several copper surface treatments have been developed to increase the bond strength between the layers of the multilayer PCB sandwich.

One such copper surface treatment is the use of immersion tin and tin alloys as a bonding medium for multilayer circuits as disclosed by Holtzman et al., U.S. Pat. No. 4,715,894. In the disclosed process an immersion tin composition is disclosed containing both thiourea compounds and urea compounds to displacement plate the copper surface of each PCB with tin by the immersion process prior to laminating them to form a multilayer board. Although bond strength of multilayer PCB's prepared by this immersion process was improved, the production efficiency of multilayer PCB's is limited by the batch process wherein substantial quantities of plating bath is lost through drag-out of the solution with each PCB processed. Moreover, the PCB's made by this immersion process are susceptible to defects due to streaking described supra.

Innerlayer bonding of multilayer PCB's has been further improved by the process disclosed in assignee's U.S. patent application, Ser. No. 07/446335, filed Dec. 5, 1989, now U.S. Pat. No. 5,073,456 and in a publication in "Printed Circuit Fabrication", Vol. 13, No. 5, May 1990 by K. H. Dietz, J. V. Palladino and A. C. Vitale, entitled MULTILAYER BONDING: CURRENT TECHNOLOGY AND A NEW ALTERNATIVE. The in-line process disclosed includes a spray displacement tin plating step followed by a post-treatment step with a silane bonding mixture of a ureido silane and a disilyl crosslinking agent. In particular, PCB's are fed by conveyor through a series of treatment and rinse stations in which the PCB's are sequentially cleaned, microetched, spray tin displacement plated, post-treated with the silane bonding mixture and dried. The PCB's prepared by this spray tin displacement plating system are substantially free of streak defects observed in the immersion batch process and the multilayer PCB's prepared therefrom demonstrate improved resistance to delamination during typical high temperature soldering operations. During the plating process the plating solution is sprayed onto the PCB and the excess solution is recovered and returned to the plating bath sump with minimal drag-out to succeeding rinse stations. Although improved multilayer PCB's have been obtained by the disclosed process, it has now been observed that the activity of the plating bath solution declines during use due to the accumulation of tin(IV) ion formed by aerial oxidation of tin(II) during the spray application step.

Commercial displacement tin plating processes such as those described supra, use thiourea as the complexing agent of choice. However, since thiourea is a toxic material and has been identified as a carcinogen, additional measures are needed in disposing of the process wastes and rendering them innocuous to the environment. Thus, wastes containing thiourea and cuprous thiourea complex produced by this process may be disposed of using conventional waste-treatment processes such as the waste-treatment process using hydrogen peroxide disclosed by Dietz et al. supra wherein the treatment reduces concentrations of thiourea to less than 1 ppm. However such waste treatment processes add to the overall costs of circuit board production. There is a need for a complexing agent which is innocuous to the environment and which can effectively replace thiourea in its plating characteristics.

SUMMARY OF THE INVENTION

An environmentally innocuous effective replacement for thiourea has been found for the plating bath of this invention which is an aqueous plating solution for the displacement plating of a substrate metal surface with an other metal comprising:

(i) a metal ion of a free metal, wherein the free metal is different from the metal of the substrate surface;

(ii) a complexing agent which is an imidazole-2-thione compound of the formula:

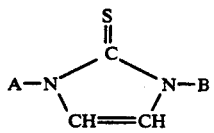

wherein A and B are the same or different —R—Y groups, wherein R is a linear, branched or cyclic alkenyl group containing 1 to 12 carbon atoms and Y is a hydrogen, halogen, cyano, vinyl, phenyl, or ether moiety and (iii) an acid.

In an embodiment of the present invention, the metal ion is a cation which is present in its lowest oxidation state and the imidazole-2-thione compound is an unsymmetrical 1,3-dialkylimidazole-2-thione wherein A is methyl or ethyl, and when A is methyl, B is a $C_3$ to $C_6$ alkyl or cycloalkyl group, and when A is ethyl, B is a $C_4$ to $C_6$ alkyl or cycloalkyl group.

In another embodiment of this invention, the plating solution is maintained under an inert atmosphere which is substantially free of oxygen.

In still another embodiment of this invention the aqueous plating solution also contains therein a free metal (iv) which is the free metal of the metal ions (i). In particular this invention includes a process for displacement plating a substrate metal surface with an other metal comprising the steps:

(a) providing a reservoir of aqueous plating solution comprising;

(i) a metal ion of a free metal, which is present in its lowest oxidation state wherein the free metal is different from the metal of the substrate surface;

(ii) a complexing agent which is a 1,3-dialkylimidazole-2-thione compound of the formula:

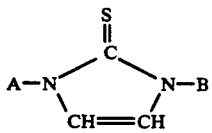

wherein A is methyl or ethyl, and when A is methyl, B is a $C_3$ to $C_6$ alkyl or cycloalkyl group, and when A is ethyl, B is a $C_4$ to $C_6$ alkyl or cycloalkyl group;

(iii) an acid; and (iv) a free metal which is the free metal of the metal ions present in their lowest oxidation state (i);

(b) directing a stream of the aqueous plating solution onto the substrate metal surface; whereby a portion of the metal ions of (i) are oxidized to ions in a higher oxidation state, and another portion of the metal ions of (i) are reduced to free metal, wherein said reduced free metal displaces surface substrate metal which is oxidized to an ion and complexed with the complexing agent to form a substrate metal ion complex dissolved in the reacted aqueous plating solution at the surface of the substrate metal; and (c) returning the plating solution to the reservoir whereby at least a portion of the metal ions present in their higher oxidation state are reacted with free metal (iv) to form metal ions present in their lowest oxidation state to replenish the aqueous plating solution.

In step (c) of the process of the present invention, the portion of the formed metal ions present in their lowest oxidation state is twice the portion of the metal ions present in their higher oxidation state which reacted with the free metal (iv). The extent of conversion of the metal ions present in their higher oxidation state to the formed metal ions present in their lowest oxidation state is controlled by the available surface area of the free metal (iv) in the reservoir volume of the aqueous plating solution. In the process of the present invention, the ratio of the surface area of the free metal (iv), to the volume of the aqueous plating solution typically is at least 4 in$^2$/gallon (6.8 cm$^2$/liter).

DETAILED DESCRIPTION OF THE INVENTION

The present invention is directed to an environmentally innocuous effective replacement for thiourea in displacement plating processes in which the plating solution is applied to the substrate surface to be plated by immersion or by spraying, cascading, pouring and the like. The present invention is also directed to the reduction of objectionable waste generated by such a plating process.

Displacement plating solutions are known and include immersion tin and tin alloy solutions such as disclosed in Holtzman et al., U.S. Pat. No. 4,715,894, which is incorporated herein by reference. The displacement metal plating process does not employ an electric current but is based on an electrochemical displacement reaction. The metal substrate that is to be plated generally is more active (less noble) than the metal salt that is dissolved in the coating composition or plating solution. Copper may be plated by tin solution even though copper is more noble than tin when the immersion coating composition is acidic and contains thiourea as a so-called complexing agent. It has been theorized that the relative electrode potentials of tin and copper are reversed in the presence of thiourea under acidic conditions. Once the metal substrate is completely coated, it is no longer available to displace the metal ions in the displacement coating composition.

The present invention is directed towards a replacement for the thiourea complexing agent. The replacement is a imidazole-2-thione compound of the formula:

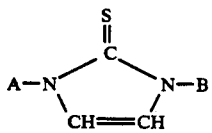

wherein A and B are independently hydrocarbyl or substituted hydrocarbyl. More particularly A and B are the same or different —R—Y groups, wherein R is linear, branched or cyclic alkenyl group containing 1 to 12 carbon atoms and Y is a hydrogen, halogen, cyano, vinyl, phenyl, or ether moiety. Preferably, the compound is a 1,3-dialkylimidazole-2-thione compound wherein A and B each individually is an alkyl or cycloalkyl group containing one to six carbon atoms. The imidazole-2-thione compound may be symmetrical, i.e., A and B are the same group, or unsymmetrical. Preferred are unsymmetrical 1,3-dialkylimidazole-2-thione compounds wherein A is methyl or ethyl, and when A is methyl, B is a $C_3$ to $C_6$ alkyl or cycloalkyl group, and when A is ethyl, B is a $C_4$ to $C_6$ alkyl or cycloalkyl group.

Displacement tin plating solutions are particularly susceptible to aerial oxidation. Consequently, application of such solutions typically has been limited to immersing or dipping substrates into the plating solution, thereby minimizing aerial oxidation of the plating bath. A spray displacement tin plating process for bonding multilayer printed circuit boards has been disclosed in Palladino, U.S. Pat. No. 5,073,456 (assignee's U.S. patent application, Ser. No. 07/446,335, filed Dec. 5, 1989), and in a publication in "Printed Circuit Fabrication", Vol. 13, No. 5, May 1990, by K. H. Dietz, J. V. Palladino and A. C. Vitale, entitled MULTILAYER BONDING: CURRENT TECHNOLOGY AND A NEW ALTERNATIVE, both of which are included herein by reference. Such an in-line spray process while having advantages over the batch immersion process, is particularly impacted by aerial oxidation and build up of by-products in the plating solution. In Assignee's copending U.S. patent application, U.S. Ser. No. 07/799,135 filed of even date, which is incorporated herein by reference, the invention is directed to minimizing or eliminating such limiting oxidation effects on the spray displacement plating process and particularly the tin plating process.

The present invention will be described in the context of a spray displacement tin plating process particularly for the manufacture of multilayer printed circuit boards but it is not intended to be limited thereby. The multilayer printed circuit board has alternating layers of dielectric material which support copper circuitry (which may have interspaced other layers such as a copper sheet which serves as a ground plane) which are adhered to an insulating layer through intermediate layers. The circuit board has conductive through holes which form electrical paths across the entire thickness of the board.

In formation of multilayer circuit boards several dozen conductive and nonconductive layers can be employed. Also, for formation of multilayer circuit boards, it is necessary to drill holes and defects can occur due to delamination of layers in the areas immediately surrounding a hole. If a defect is present in one of the layers or if delamination occurs, generally the entire board must be scrapped. Therefore high quality in each of the steps of formation of the printed circuit board is essential for commercial production. One such step for forming high quality multilayer boards is the formation of defect free tin plating over the copper circuitry of each constituent board.

A starting material in the present invention is a dielectric layer which contains on one or opposite surfaces a cladding of copper. This copper layer is of a thickness of at least 4 microns and more preferably 32 microns and it is used to form conductive circuitry. Well known techniques can be employed to form such circuitry such as described in Coombs supra. The composition of the dielectric layer is not critical provided it functions as an electrical insulator. Preferably, a partially cured thermosetting polymer composition is employed which is known in the art as prepreg or "B" stage resin.

After formation of the conductive circuitry, it is necessary to form a thin outer layer of tin thereon. The circuitry of the printed circuit board typically is first cleaned and etched, such as disclosed in Palladino supra.

The cleaned and etched printed circuit board is then tin plated using the process of this invention which is a process for displacement plating a copper surface of a printed circuit board with tin or a tin alloy comprising the steps:

(a) providing a reservoir of aqueous displacement tin plating solution comprising;
  (i) tin(II) ion,
  (ii) a complexing agent which is a compound of the formula:

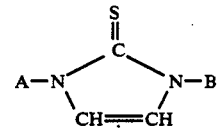

wherein A is methyl or ethyl, and when A is methyl, B is a $C_3$ to $C_6$ alkyl or cycloalkyl group, and when A is ethyl, B is a $C_4$ to $C_6$ alkyl or cycloalkyl group
  (iii) an acid, and
  (iv) free tin metal; wherein the ratio of the surface area of the free tin metal to the volume of the aqueous displacement tin plating solution is at least 4 $in^2$/gallon (6.8 $cm^2$/liter);

(b) spraying a stream of the aqueous displacement tin plating solution from the reservoir onto the copper surface; whereby a portion of the tin(II) ion is aerially oxidized to a tin(IV) ion, and whereby the tin(II) ion is reduced to the free metal to displace surface copper which is oxidized to cuprous ion and complexed with the complexing agent to form a cuprous complex dissolved in the reacted aqueous displacement tin plating solution at the surface of the copper; and (c) returning the sprayed and reacted aqueous displacement tin plating solution to the reservoir so that the portion of the tin(IV) ion formed is reacted with the surface of the free tin to form twice the portion of tin(II) ion, so that the aqueous displacement tin plating solution of step (a) is replenished with the portion of the tin(II) ion formed. The aqueous displacement tin plating solution may contain additional components such as urea, reducing agents, surfactants and the like as disclosed in Holtzman et al. supra and Palladino supra. When a tin alloy is to be plated, a salt of a second metal such as lead, is present in the solution. In a preferred embodiment, the aqueous displacement tin plating solution contains a complexing agent of this invention, a tin(II) salt, a reducing agent, an acid and a urea compound.

Alternatively the present invention is also directed to a process for immersion plating a substrate metal surface with an other metal comprising the steps:

(a) providing a reservoir of aqueous plating solution comprising;
 (i) a metal ion of a free metal, wherein the free metal is different from the metal of the substrate surface;
 (ii) a complexing agent which is a 1,3-dialkylimidazole-2-thione compound of the formula:

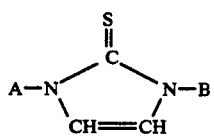

wherein A and B each individually is an alkyl or cycloalkyl group containing one to six carbon atoms; and
 (iii) an acid;

(b) immersing the substrate metal surface into the aqueous plating solution; whereby a portion of the metal ions of the free metal (i) are reduced to free metal, wherein said reduced free metal displaces surface substrate metal which is oxidized to an ion and complexed with the complexing agent to form a substrate metal ion complex dissolved in the reacted aqueous plating solution at the surface of the substrate metal;

(c) removing the plated substrate metal surface from the plating solution reservoir; and (d) removing excess plating solution from the plated substrate metal surface thereby terminating the displacement plating process.

Complexing agents which are as effective as thiourea and are environmentally innocuous are the dialkylimidazole-2-thione compounds of this invention. Preferably these complexing agents are unsymmetrical and have the formula:

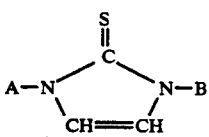

wherein A is methyl or ethyl, and when A is methyl, B is a $C_3$ to $C_6$ alkyl or cycloalkyl group, and when A is ethyl, B is a $C_4$ to $C_6$ alkyl or cycloalkyl group. Preferred of this class of complexing agents is 1-methyl-3-propylimidazole-2-thione having the formula:

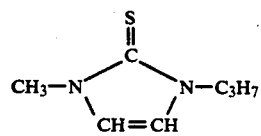

Alternatively, symmetrical 1,3-dialkylimidazole-2-thione compounds of the formula:

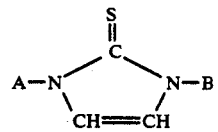

wherein A and B are the same alkyl or cycloalkyl group containing one to six carbon atoms. Preferred of this class of complexing agents is 1,3-dimethylimidazole-2-thione.

The tin(II) salts of an inorganic (mineral) acid such as the sulfur, phosphorous and halogen acids may be used or organic acid may be used (e.g., tin(II) formate, tin(II) acetate and the like). Preferred are the tin(II) salts of the sulfur acids such as sulfuric acid and sulfamic acid. Alkali metal stannates may also be used such as sodium or potassium stannate and the known equivalents thereof. Where tin/lead alloy coatings are deposited, lead acetate may be used as the lead salt.

Free tin metal may be present in the aqueous displacement tin plating solution in any form, e.g., extruded tin, "mossy" tin, cast tin, and the like. Extruded tin, such as the tin slabs conventionally used as electrolytic anodes or tin wire, is preferred since the amount needed to control stabilization of the solution is easily adjusted by removing or adding portions of the tin to achieve the desired surface to volume ratio. The ratio of the tin surface to the volume of the aqueous displacement tin plating solution typically will be at least about 4 in$^2$/gallon (6.8 cm$^2$/liter) and preferable about 16 in$^2$/gallon (27.2 cm$^2$/liter) or greater.

The acids that are used may be organic acids or inorganic acids (mineral acids) based on sulfur, phosphorous, the halogens, or the mixtures thereof, the sulfur based mineral acids being preferred such as sulfuric acid and sulfamic acid. Particularly preferred is the mixture of sulfuric acid and hypophosphorous acid. Some of the organic acids that may be used comprise monocarboxylic or dicarboxylic acids having up to about six carbon atoms such as formic acid, acetic acid, malic acid, maleic acid, and the like.

It is preferred, if possible, not to use halogen acids or halogen salts since halide residues will be produced in the tin coating deposited. Halide salts interfere with electrical properties of the tin and may also act as corrosive materials in the coating.

When the solubility of the complexing agent of the present invention in the aqueous plating solution is low, a cosolvent may be added to solubilize the complexing agent and thereby enhance the plating activity of the resulting solution. Suitable cosolvents are water miscible solvents such as alcohols, e.g., ethanol; glycols, e.g., ethylene glycol; alkoxyalkanols, e.g., 2-butoxyethanol; ketones, e.g., acetone; aprotic solvents such as dimethylformamide, dimethyl sulfoxide, acetonitrile, and the like; and mixtures thereof.

The urea compound that may be used may be either urea or the various art known derivatives, homologes, or analogs thereof such as disclosed in columns 12 through 15 of Holtzman et al., U.S. Pat. No. 4,715,894 which has been incorporated herein by reference supra. Urea is preferred.

Chelating agents that may be used generally comprise the various classes of chelating agents and specific compounds disclosed in Kirk-Othmer, Encyclopedia of Chemical Technology, Third Edition, Volume 5, pages 339-368 incorporated herein by reference. Chelating agents that are especially preferred comprise aminocarboxylic acids and hydroxycarboxylic acids. Some aminocarboxylic acids that may be used comprise ethylenediaminetetraacetic acid, hydroxyethylethylenediaminetriacetic acid, nitrilotriacetic acid, N-dihydroxyethylglycine, and ethylenebis(hydroxyphenylglycine). Hydroxy carboxylic acids that may be used comprise tartaric acid, citric acid, gluconic acid and 5-sulfosalicylic acid.

The various reducing agents that may be used are well known in the art and generally comprise organic aldehydes whether saturated or unsaturated, aliphatic or cyclic, having up to about ten carbon atoms. Lower alkyl aldehydes having up to about six carbon atoms may be employed in this respect such as formaldehyde, acetaldehyde, propionaldehyde, butyraldehyde, and the like. Especially preferred aldehydes comprise hydroxy aliphatic aldehydes such as glyceraldehyde, erythrose, threose, arabinose and the various position isomers thereof, and glucose and the various position isomers thereof. Glucose has been found to act to prevent oxidation of the metal salts to a higher oxidation state, e.g., tin(II) ion to tin(IV) ion, but also as a chelating agent and is especially useful for these reasons.

The surfactants that may be used comprise any such as those listed in Kirk-Othmer, *Encyclopedia of Chemical Technology*, Third Edition, Volume 22, pages 32-387 incorporated herein by reference. The nonionic surfactants are especially preferred.

The various components of the aqueous displacement plating solution may be present at conventionally established concentrations. Typically, the displacement plating solution will contain on a molar basis:

about 1 to about 15 parts of the displacement metal ion;

about 10 to about 125 parts of the complexing agent compound; and about 1 to about 360 parts of an acid.

The solution may also contain on a molar basis;

about 10 to about 125 parts of a urea compound;

about 5 to about 40 parts of a chelating agent; and about 5 to about 110 parts of a reducing agent.

The solution concentrations may, of course, vary depending on the particular plating application intended.

In the process for the manufacture of multilayer circuit boards, the tin coated copper circuitry of each component circuit board is further treated to form a thin layer of an oxide, hydroxide or combination thereof on the surface of the tin in order to improve the bonding to the interleaved dielectric layers. Preferably, the treated tin surface is further treated with a silane bonding mixture to further improve bonding of the component layers of the multilayer circuit board during throughout its manufacture and end use life. The silane bonding mixture is a mixture of a ureido silane and a disilyl crosslinking agent which was disclosed in Palladino supra.

In addition to its use in the manufacture of multilayer printed circuit boards described supra, the stabilized spray displacement plating process of this invention may be used in other plating applications, e.g., as an etch resist in the manufacture of printed circuit boards. In the plate-and-etch method of circuit board manufacture, a polymeric or resin resist image is first formed on a copper clad circuit board substrate and then a metal resistant to etchants is plated on the copper surface areas not protected by the polymer resist image to form a complimentary metal resist image. The polymer resist image is then stripped from the copper surface and the uncovered copper not protected by the metal resist image is removed from the substrate by an etchant to form the printed circuit. The use of immersion tin coatings as an etch resist in the plate-and-etch process is disclosed in Holtzman et al., U.S. Pat. No. 4,657,632 which is incorporated herein by reference wherein an etch resist immersion tin composition is selectively applied to the metal layer to leave areas of coated and uncoated metal followed by etching the metal not coated with the resist. In the disclosed process, immersion tin composition is applied as a substantially pore free coating at thicknesses from about 0.08 to about 0.175 microns. Holtzman et al., '632, further discloses that such immersion tin coatings overcome deficiencies in conventional electroplated tin-lead resists during subsequent soldering operations. In the conventional soldering operation, a solder mask is first applied to the printed circuit board to cover all board areas except where components are to be soldered thereto. Prior to the application of the solder mask the electrolytically deposited tin-lead etch resist on the circuit is removed by reflowing it at elevated temperatures and since the removal is not always uniform the circuit board sometimes has to be subjected to a leveling process. Such a leveling process comprises passing the board over a hot air knife, i.e., a constricted elongated hot air jet. Holtzman et al., '632, disclose that when immersion tin coatings are used as the resist, the reflow and hot air leveling steps can be eliminated.

The spray displacement plating process of this invention and its equivalents described supra may be used to produce superior etching resists for the plate-and-etch manufacture of circuit boards. When used to produce an etching resist, the aqueous displacement plating solution of this invention, will contain a water soluble salt of the displacement metal ion present in its lowest oxidation state. Such metal salts comprise those based on metals of group IVA; VB; VIB; VIIB; VIIIIB; IIB and IIIA of the Periodic Table of the Elements; The group IVA, VIII, IB, IIB, and IIIA metals being preferred; and the group IVA, VIII, and IB metals being especially preferred. Preferred metals which fall into this class are tin, lead, mercury, nickel, gold, silver, indium, germanium and palladium. The anions of these metal salts are the same as those defined herein for the tin salts. Particularly preferred are tin and various combinations of tin and other metals such as tin-lead, tin-nickel, tin-mercury and the like. Additionally, the metal salts as defined above and herein are typically employed in their lowest oxidation states, e.g., stannous tin(II); nickelous Ni(II); mercurous Hg(I); aurous Au(I) and the like. In one embodiment it is preferred to employ tin in its lowest oxidation state whereas any of the other metal salts may be employed in any oxidation state. Various mixtures of these other metal salts may also be employed. Salts of germanium, lead, mercury, silver, indium, gold and palladium are especially suitable.

In the instance when a solder mask is to be applied to a printed circuit substrate, displacement plating of the copper printed circuit may be deferred until after the solder mask has been applied, or displacement plating may be repeated prior to the soldering operation. Such deferral or repetition can improve the solder wetability of the plated connection sites during assembly and soldering of components to the circuit.

The use of the complexing agents of this invention in the displacement plating process will now be illustrated by the following examples but is not intended to be limited thereby. In each of the following examples, Compound 1 is the unsymmetrical dialkyl complexing agent of this invention 1-methyl-3-propylimidazole-2-thione, which has the structure as given supra.

EXAMPLE 1

An immersion tin plating solution was made by combining 0.3 g of compound 1, 5 ml of 10% sulfuric acid solution, and 0.1 g of tin(II) sulfate. After shaking the mixture for a short period, there resulted a colorless, slightly turbid solution.

The efficacy of this solution for immersion tin plating was tested in the following manner. A strip of 1 ounce rolled-annealed (RA) copper foil was partially immersed in the plating solution for 1 minute at ambient temperature. After 1 minute, the foil was removed, rinsed thoroughly with tap and DI (deionized) water, dried with a paper towel, and then examined. There resulted a uniform plating of bright, shiny tin on the entire copper surface that had been immersed. Visually, the quality and uniformity of the plated immersion tin produced with this unsymmetrical complexing agent appeared to be as good as that obtained with thiourea.

COMPARATIVE EXAMPLE 1

An attempt was made to make a plating solution with the symmetrical Compound 2, 1,3-dimethylimidazole-2-thione in place of Compound 1. An immersion plating bath was prepared in which 0.31 g of the symmetrical compound, 5 ml of 10% sulfuric acid solution, and 0.1 g of tin(II) sulfate were mixed together for several minutes in an attempt to solubilize the solid components. Only a small portion at most of the solid components dissolved. The mixture was tested for plating efficacy using the standard test described in Example 1 with 1, 5 and 330 minute immersion periods. There was no plating of tin on the copper foil test strips in any of these test cases.

EXAMPLE 2

A fresh immersion tin plating solution was made by combining 0.3 g of Compound 1, 5 ml of 10% sulfuric acid solution, and 0.12 g of tin(II) sulfate. After shaking the mixture for a short period, there resulted a homogeneous colorless solution.

The efficacy of this solution to produce immersion tin plating was tested in the manner described in Example 1. There was plated an immersion tin coating that was shiny, uniform, and visually equivalent to that obtained with thiourea as the complexing agent.

To test the effect of hypophosphorous acid on the stability of tin in a soluble form, 0.2 ml of 40% hypophosphorous acid was added to this plating solution. After mixing, the solution remained clear and colorless. The resulting solution was still effective for plating immersion tin on copper without any apparent loss of uniformity or quality. The presence of hypophosphorous acid in the immersion tin formulation has no apparent effect upon the ability of Compound 1 to function as an alternate complexing agent to thiourea.

The plating solution containing hypophosphorous acid was allowed to stand for 5 days in a covered vial, and then it was checked for plating efficacy. At this point, the solution did not produce immersion tin plating using the standard test described in Example 1.

EXAMPLE 3

Two immersion tin plating solutions were prepared in this example and tested for plating efficacy on a daily basis. The first plating solution (#1) did not contain hypophosphorous acid, while the second plating solution (#2) did contain hypophosphorous acid.

Solution #1 was prepared by combining and mixing 0.31 g of Compound 1, 5 ml of 10% sulfuric acid solution, and 0.12 g of tin(II) sulfate. Solution #2 was prepared by combining and mixing 0.31 g of Compound 1, 5 ml of 10% sulfuric acid solution, 0.12 g of tin(II) sulfate, and 0.2 ml of 40% hypophosphorous acid. Both solutions behaved similarly with regard to plating quality and changes with time in the ability to produce plating. Both solutions were effective in producing shiny, uniform tin plating during the first day, gave noticeably poorer performance on the second day, and were completely inactive after the third day, at which point significant amounts of oily droplets had separated as a second phase in both cases.

After the solutions had been standing for approximately 20 days in covered containers, they were combined and extracted with methylene chloride. The solvent was then removed in vacuo on a rotary evaporator to afford approximately 200 mg of an oil. NMR analysis of this recovered oil indicated that the sample was identical to that of Compound 1.

EXAMPLE 4

Two immersion tin plating samples were prepared with Compound 1 and tested for activity as a function of time. In these two samples, the initial level of tin(II) ion was calculated to be 11 g/L. An acid solution was prepared first by combining and mixing 10 ml of sulfuric acid, 90 ml of deionized water, and 4 ml of 50% hypophosphorous acid. The two plating solutions were then prepared using this acid solution plus the other components. Plating solution #1 was prepared by combining and mixing 0.61 g of Compound 1, 0.22 g of tin(II) sulfate, 10 ml of the acid solution, and 0.34 g of mossy tin. Plating solution #2 was prepared by combining and mixing 0.61 g of Compound 1, 0.22 g of tin(II) sulfate, and 10 ml of the acid solution. Both plating samples initially produced plating of bright, shiny tin. Solution #1, containing the solid tin, was effective for tin plating over at least 12 days, while solution #2, without any solid tin, was completely ineffective (no tin plated on copper) after 4 days or less. During the test period, the solutions were maintained in loosely capped vials, such that air was able to contact the sample.

EXAMPLE 5

Two plating solutions were prepared with Compound 1 and tested for activity as a function of time. In these two solutions, the initial level of tin(II) was 6 g/L. Plating solution #1 was prepared by combining and mixing 0.62 g of Compound 1, 0.11 g of tin(II) sulfate, 10 ml of the acid solution (from Example 4), and 0.37 g of mossy tin. Plating sample #2 was prepared by combining and mixing 0.62 g of Compound 1, 0.11 g of tin(II) sulfate, and 10 ml of the acid solution. The liquid portion of both freshly made samples was yellowish and somewhat turbid, but essentially a homogeneous solution. Both plating samples initially produced plating of bright, shiny tin. Sample #1, containing the solid tin, was effective for tin plating over at least 12 days, while sample #2, without any solid tin, was completely ineffective (no tin plated on copper) after 4 days or less. During the test period, the samples were maintained in loosely capped vials, such that air was able to contact the sample.

EXAMPLE 6

Two plating samples were made with Compound 1 and tested for activity as a function of time. In these two samples, the initial level of tin(II) ion was 11 g/L and the level of Compound 1 was higher than in the earlier examples. (In this example, the level was equal to an equivalent amount rather than an equal weight amount relative to the normal thiourea level in a standard immersion tin formulation with thiourea.) Plating sample #1 was made by combining and mixing 1.23 g of Compound 1, 0.2 g of tin(II) sulfate, 10 ml of the acid solution (see Example 4), and 0.36 g of mossy tin. Plating sample #2 was made by combining and mixing 1.23 g of Compound 1, 0.21 g of tin(II) sulfate, and 10 ml of the acid solution. The liquid portion of both freshly made samples was yellowish and somewhat turbid, but essentially a homogeneous solution. Both plating samples initially produced plating of bright, shiny tin. Sample #1, containing the solid tin, was effective for tin plating over at least 12 days, while sample #2, without any solid tin, was completely ineffective (no tin plated on copper) after 6 days or less. During the test period, the samples were maintained in loosely capped vials, such that air was able to contact the sample.

Sample #1 was checked for plating activity 15 days after day 12 from above. At this point in time, the sample contained an extensive amount of white solid precipitate. The sample was completely inactive with regard to tin plating (no tin plated on copper).

Sample #2 was further tested for plating activity on day #27 after it had been made. The sample, which had been kept in a loosely capped vial since it had been made, contained a second phase at this point. The sample was shaken to afford a suspension. The standard plating test was run to confirm complete inactivity for producing tin plating. At this point, 0.2 g of tin(II) sulfate was added, and the resulting mixture was shaken. The addition of tin(II) ion resulted in complete solubilization to a yellow solution. The yellow solution was now active in plating shiny, uniform tin on copper using the standard test.

EXAMPLE 7

A plating sample was made with Compound 1 and tested for activity as a function of time. In this sample, the initial level of tin(II) ion was 22 g/L, and the sample contained an equivalent amount of compound 1 as in Example 6. The plating sample was made by combining and mixing 1.23 g of Compound 1, 0.40 g of tin(II) sulfate, 10 ml of the acid solution, and approximately 0.3-0.4 g of mossy tin to produce a homogeneous yellow solution that was slightly turbid (for the liquid portion). The sample was active for plating bright, shiny tin on copper for at least 12 days. During the test period, the sample was maintained in a loosely capped vial, such that air was able to contact the sample.

On day #27 from the date of sample makeup, the sample was examined and tested for plating activity. At this point, the sample contained white solids and was inactive in tin plating. Tin(II) sulfate (0.4 g) was added and shaken to give a mixture. This mixture was tested for plating activity using the standard test and was found to plate shiny, uniform tin.

EXAMPLE 8

Two plating samples were made with Compound 1 and tin(IV) sulfate and tested for plating activity as a function of time. In these two samples, the initial level of tin(IV) ion was 11 g/L. Plating sample #1 was made by combining and mixing 0.6 g of Compound 1, 0.29 g of tin(IV) sulfate, 10 ml of acid solution (see Example 4), and 0.34 g of mossy tin. Plating sample #2 was made by combining and mixing 0.6 g of Compound 1, 0.29 g of tin(IV) sulfate, and 10 ml of acid solution. There resulted for the liquid portion of both samples a homogeneous, slightly turbid yellow solution. Both samples were found to plate bright uniform tin for at least 15 days, during which test period, the samples were maintained in loosely capped vials, such that air was able to contact the sample.

EXAMPLE 9

A plating sample was prepared which consisted of 10 ml of 10% sulfuric acid, 0.5 g of stannous sulfate, 1 g of ethylene glycol, and 2 g of Compound 1. The fresh plating solution produced the plating of bright, uniform tin. The sample was maintained in a closed vial for approximately 8 months, during which time some solid material precipitated onto the bottom of the vial. The sample was tested at the end of the eight month period and was found to still be active in plating bright, uniform tin on a copper surface.

EXAMPLE 10

A displacement plating bath was prepared similar to that given in Comparative Example 1 except an organic cosolvent was also included. A plating bath was prepared which consisted of 0.3 g of Compound 2, 0.1 g of stannous sulfate, 5 ml of 10 % sulfuric acid solution, and 1 g of ethylene glycol. The mixture, contained in a closed vial, was alternately shaken and warmed in an attempt to solubilize all of the solid components. This was not achieved; approximately one-third of the thione remained undissolved. The plating efficacy of this bath was tested using the standard test with a strip of rolled-annealed (RA) copper foil. There was some tin plating on the immersed copper surface tested, but the extent was minimal and plating was very spotty.

The above plating bath was modified by the addition of a second 0.1 g portion of stannous sulfate. The resulting mixture was again alternately shaken and warmed in an attempt to solubilize all of the solid components. More of the thione was solubilized, but some solid still remained. The efficacy for plating tin of the resulting plating bath sample was tested using the standard test. This mixture produced plating of shiny, uniform tin coating which appeared to be somewhat thin, but not so much so that any copper coloration was visible.

The above plating bath was further modified by the addition of a second 1 g portion of ethylene glycol. The resulting mixture was again alternately shaken and warmed in an attempt to solubilize all of the solid components. Most of the thione was solubilized, but some still remained as a solid. The efficacy for plating tin of the resulting plating bath was tested and found to produce poorer quality plating in comparison with the bath after the first modification. Tin was still plated but the tin coating was very thin and had a distinct copper coloration.

It was concluded that inclusion in the formulation of a suitable cosolvent is beneficial for promoting solubility and activity of thione complexing agents in displacement plating baths. This is especially true and necessary if the thione has very limited solubility in aqueous media such as for Compound 2.

EXAMPLE 11

A plating sample was prepared using deuterated solvents to enable characterization by NMR (nuclear magetic resonance spectroscopy). The plating mixture consisted of 10 ml of deuterium oxide, 1 g of deuterated sulfuric acid, 0.35 g of stannic sulfate, and 0.6 g of Compound 1. The mixture which consisted of two phases, was prepared and maintained under nitrogen. The plating activity was tested using a strip of copper foil. The plating sample produced plating of tin on the copper surface. The tin coating was spotty and of poor quality.

To the above plating mixture, 1 g of ethanol was added in a single portion and mixed to produce a nearly homogeneous solution. The plating activity and quality of the resulting sample were tested. The plating solution was active and produced a bright, uniform tin coating. It was concluded from the results of this example and earlier examples that the use of cosolvents in displacement tin plating solutions can be beneficial, especially when the plating baths contain significant levels of tin-(IV) and/or relatively insoluble thione complexing agents.

EXAMPLE 12

A plating sample was prepared using deulerated solvents to enable characterization by NMR (nuclear magnetic resonance spectroscopy). The plating solution consisted of 10 ml of deuterium oxide, 1 g of deuterated sulfuric acid, 0.2 g of stannous sulfate, and 0.6 g of Compound 1. In this experiment, no special measures were taken to exclude air from contacting the sample. The efficacy of the plating solution was tested periodically using a strip of copper foil which was immersed in the solution for 5 minutes. The solution was active in plating tin on copper for at least 8 days. On the fourteenth day after solution had been prepared, the plating solution was found to be completely inactive for plating tin on copper.

EXAMPLE 13

A fresh plating solution was prepared having the same composition as given in Example 12. In this instance, the solution was prepared and maintained under a nitrogen atmosphere throughout the course of the plating process. The efficacy of the solution for plating tin on copper foil was tested periodically. The solution was active in plating bright, uniform tin over at least 17 days. On the forty ninth day, the solution was tested for plating activity and still found to be somewhat active, with the plated tin being thin and spotty. It was concluded that the absence of air significantly extends the life of the plating solution.

The above examples demonstrate that fresh immersion tin plating baths containing 1-methyl-3-propyimidazole-2-thione as the complexing agent are as effective for displacement plating of copper as such baths containing thiourea as the complexing agent. It was also observed that prolonged exposure to air degraded the plating activity but that the activity could be maintained or restored by replenishment with tin(II) ion. Use of a cosolvent like ethylene glycol, ethanol and the like can also be beneficial in solubilizing the complexing agent. Replenishment of tin(II) ion was accomplished by addition of free tin metal to the plating bath. In accordance with these observations, stable plating activity is expected for the spray displacement tin plating using the following procedures.

Innerlayers for the manufacture of multilayer printed circuit boards are chemically cleaned, treated with a displacement tin composition and a silane bonding mixture in an in-line, conveyorized, spray treatment system such as disclosed in Palladino supra and in Dietz et al. supra.

The in-line spray system used to prepare the innerlayer panel surfaces has a conveyor speed of 4 feet per minute and contains the following process steps and conditions.

|  | Conveyor Length | Rinse Solution Water Flow | Temp. (°F.) | Spray Pressure (PSI) |
|---|---|---|---|---|
| 1. Panel Feed (Input) | 23" | — | — | — |
| 2. Alkaline Cleaner | 20" | — | 120 | 25 |
| 3. Double CC Rinse[a] | 20" | — | 60 | 20 |
| 4. Microetch | 38" | — | 85 | 25 |
| 5. Triple CC Rinse[b] | 30" | 4 GPM[c] | 60 | 20 |
| 6. Displacement Tin Application | 48" | — | 75 | 25 |
| 7. Triple CC Rinse[d] | 30" | 4 GPM[c] | 110 | 25 |
| 8. Air Knife Drying | 13" | — | 105 | — |
| 9. Silane Treatment | 20" | — | 75 | 25 |
| 10. Hot Air Dryer | 30" | — | 130 | — |
| 11. Output Conveyor | 41" | — | — | — |

[a]Double CC Rinse (the term "CC" means counter current) is a two stage rinse wherein the last stage is fed by the acidic effluent of the Triple CC rinse of Step 5, the first stage is fed by the effluent of the last stage and the effluent of the first stage is discarded.
[b]Triple CC Rinse is a three stage rinse wherein the last stage is fed by a high quality water source, e.g., softened water, the second stage is fed by the effluent of the last stage, the first stage is fed by the effluent of the second stage and the acidic effluent of the first stage is fed to the double CC rinse of Step 3.
[c]GPM is gallons per minute.
[d]Triple CC Rinse is a three stage rinse wherein the last stage is fed by deionized water, the second stage is fed by the effluent of the last stage, the first stage is fed by the effluent of the second stage and the effluent of the first stage is discarded.

The alkaline cleaner used in the system is Versa-CLEAN<sup>R</sup> 415 (Du Pont) and the microetch is SureETCH<sup>R</sup> 550 (Du Pont) potassium peroxy monosulfate/sulfuric acid.

In Step 6 the displacement tin composition is formed by mixing Solution A and Solution B of the following compositions:

| Solution A | |
|---|---|
| D.I. Water | 200 ml |
| Conc. H2SO4 | 100 ml |
| Hypophosphorus acid (50%) | 40 ml |
| tin(II) sulfate | 20 gms |
| D.I. Water | To 0.5 liter |
| Solution B | |
| Thiourea | 60 gms |
| Urea | 40 gms |
| D.I. Water | To 0.5 liter |

Sufficient solution is prepared to adequately fill the system reservoir.

In Step 9 the silane treatment solution is prepared by adding 60 ml of glacial acetic acid to 151 liters (40 gallons) of D.I. (deionized) water. 0.83% by solution weight (1571 grams) of gamma-ureidopropyltriethoxysilane coupling agent in methanol (50%) (A-1160 Union Carbide) and 0.17% by solution weight (322 grams) of 1,2-bis(trimethoxysilyl)ethane is then added followed by sufficient deionized water to produce 189 liters (50 gallons) of solution. The solution then is mixed by activating the recirculating system of the silane treatment spray module. The solution is allowed to mix for 15 to 20 minutes to insure complete hydrolysis of the organosilane to an organosilane-triol.

The concentration of tin(II) ion in the spray displacement tin solution may be monitored during use by employing the following analytical procedure:
1. Withdraw 10 ml of the displacement tin solution from the reservoir of the spray system and dilute it to 100 ml with deionized water.
2. Add 10 ml of a buffer solution prepared from 40.6 g potassium acetate, 10 ml glacial acetic acid, and 212 ml deionized water.
3. Adjust the solution pH to 4 with a 50% solution of sodium hydroxide and add 10 drops of 10 g/L methyl thymol blue indicator solution.
4. Titrate the solution with 0.05 M EDTA (ethylenediamine-tetraacetic acid) solution to the end point which is a blue to yellow color shift, e.g., deep blue to lighter brownish orange.

The tin(II) ion concentration in grams per liter is equal to the ml of EDTA used times 0.7, i.e., $[Sn^{2+}] = 0.7 \times$ ml EDTA.

The freshly prepared displacement tin solution has a tin(II) ion concentration of about 11 g/L but during use in the spray plating process the tin(II) concentration and plating activity drops due to its removal as plated tin and to aerial oxidation to tin(IV) ions. Normal replenishment procedures could be employed to raise the tin(II) ion concentration, but are ineffective in maintaining the plating efficiency at the high activity level needed for a commercial process. The activity level should be sufficiently high so that plated boards are substantially defect free. The displacement tin solution typically is discarded when the tin(II) ion can no longer be maintained above 2.0 g/L.

The innerlayers prepared during this period should pass AOI inspection immediately before they are layed-up in the manufacture of multilayer boards. The multilayer boards produced should continue to pass production qualification criteria, including thermal stress, humidity, pink ring, and adhesion testing criteria.

What is claimed is:
1. An aqueous plating solution for the displacement plating of a substrate metal surface with an other metal comprising:
    (i) a metal ion of a free metal, wherein the free metal is different from the metal of the substrate surface;
    (ii) a complexing agent which is a an imidazole-2-thione compound of the formula:

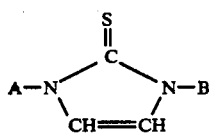

wherein A and B are the same or different —R—Y groups, wherein R is linear, branched or cyclic alkenyl group containing 1 to 12 carbon atoms and Y is a hydrogen, halogen, cyano, vinyl, phenyl, or ether moiety and
    (iii) an acid.
2. The aqueous plating solution of claim 1 wherein the metal ion is a cation which is present in its lowest oxidation state and the imidazole-2-thione compound is an unsymmetrical 1,3-dialkylimidazole-2-thione wherein A is methyl or ethyl, and when A is methyl, B is a $C_3$ to $C_6$ alkyl or cycloalkyl group, and when A is ethyl, B is a $C_4$ to $C_6$ alkyl or cycloalkyl group.
3. The aqueous plating solution of claim 2 wherein the complexing agent is 1-methyl-3-propylimidazole-2-thione having the formula:

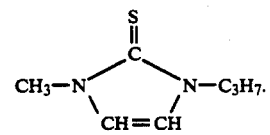

4. The aqueous plating solution of claim 2 wherein the aqueous plating solution contains one or more metal salts, the metal of the metal salt being selected from the group consisting of tin, germanium, lead, mercury, silver, indium, gold and palladium, wherein the metal ion of the metal salt is present in any oxidation state.
5. The aqueous plating solution of claim 4 wherein the cation is tin(II) and the metal of the metal salt is lead.
6. The aqueous plating solution of claim 1 wherein the the aqueous plating solution is maintained under an inert atmosphere which is substantially free of oxygen.
7. The aqueous plating solution of claim 1 wherein the aqueous plating solution contains therein a free metal (iv) which is the free metal of the metal ions (i).
8. The aqueous plating solution of claim 7 wherein the free metal (iv) is a metal of group IVA; VB; VIB; VIIB; VIII; IB; IIB and IIIA of the Periodic Table of the Elements.
9. The aqueous plating solution of claim 8 wherein the free metal (iv) is taken from the group consisting of tin, lead, mercury, nickel, gold, silver, indium, germanium, palladium, and mixtures thereof.
10. The aqueous plating solution of claim 1 wherein the substrate metal surface is copper or a copper alloy.
11. The aqueous plating solution of claim 1 wherein the metal ion (i) is a metal ion of a water soluble metal salt based on metals of group IVA; VB; VIB; VIIB; VIII; IB; IIB and IIIA of the Periodic Table of the Elements.
12. The aqueous plating solution of claim 11 wherein the metal of the water soluble metal salt is taken from the group consisting of tin, lead, mercury, nickel, gold, silver, indium, germanium, palladium and mixtures thereof.
13. The aqueous plating solution of claim 1 wherein the metal ion (i) is tin(II).
14. The aqueous plating solution of claim 1 wherein the acid (iii) is an inorganic acid based on sulfur, phosphorous, the halogens or mixtures thereof.
15. The aqueous plating solution of claim 14 wherein the acid (iii) is sulfuric acid or sulfamic acid.
16. The aqueous plating solution of claim 14 wherein the acid (iii) is a mixture of sulfuric acid and hypophosphorous acid.
17. The aqueous plating solution of claim 1 wherein the acid (iii) is an organic monocarboxylic or dicarboxylic acids having one to six carbon atoms.
18. The aqueous plating solution of claim 17 wherein the organic acid is taken from the group consisting of formic acid, acetic acid, malic acid, maleic acid, and mixtures thereof.

19. The aqueous plating solution of claim 1 wherein the aqueous plating solution contains a cosolvent.

20. The aqueous plating solution of claim 19 wherein the cosolvent is a solvent taken from the group consisting of alcohols, glycols, alkoxyalkanols, ketones and aprotic polar solvents.

21. The aqueous plating solution of claim 1 wherein the aqueous plating solution contains an additive selected from the group consisting of a urea compound, a reducing agent, a chelating agent, a surfactant, and mixtures thereof.

22. The aqueous plating solution of claim 1 wherein the substrate metal surface is the surface of electrically conductive copper circuitry adhered to at least one surface of a dielectric layer support with the circuitry having a thickness of at least 4 microns.

23. A process for displacement plating a substrate metal surface with an other metal comprising the steps:
(a) providing a reservoir of aqueous plating solution comprising;
(i) a cation of a free metal, which is present in its lowest oxidation state wherein the free metal is different from the metal of the substrate surface;
(ii) a complexing agent which is a compound of the formula:

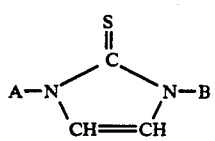

wherein A is methyl or ethyl, and when A is methyl, B is a $C_3$ to $C_6$ alkyl or cycloalkyl group, and when A is ethyl, B is a $C_4$ to $C_6$ alkyl or cycloalkyl group;
(iii) an acid; and
(iv) a free metal which is the free metal of the cation present in its lowest oxidation state (i);
(b) directing a stream of the aqueous plating solution onto the substrate metal surface; whereby a portion of the cations of (i) are oxidized to ions in a higher oxidation state, and another portion of the cations of (i) are reduced to free metal, wherein said reduced free metal displaces surface substrate metal which is oxidized to an ion and complexed with the complexing agent to form a substrate metal ion complex dissolved in the reacted aqueous plating solution at the surface of the substrate metal; and
(c) returning the plating solution to the reservoir whereby at least a portion of the metal ions present in their higher oxidation state are reacted with free metal (iv) to form cations present in their lowest oxidation state to replenish the aqueous plating solution.

24. The process of claim 23 wherein the ratio of the surface area of the free metal (iv), to the volume of the aqueous plating solution is at least 4 in$^2$/gallon (6.8 cm$^2$/liter).

25. The process of claim 23 wherein in step (c), the portion of the formed cations present in their lowest oxidation state is twice the portion of the metal ions present in their higher oxidation state which reacted with the free metal (iv).

26. The process of claim 23 wherein the substrate metal surface is the surface of electrically conductive copper circuitry adhered to at least one surface of a dielectric layer support with the circuitry having a thickness of at least 4 microns and wherein the cation present in its lowest oxidation state (i) is tin(II) ion, the complexing agent (ii) is 1-methyl-3-propylimidazole-2-thione, the acid (iii) is sulfuric acid, the free metal (iv) is tin, the metal ion present in its higher oxidation state is tin(IV) ion, and the complexed substrate metal ion is a copper complex of 1-methyl-3-propylimidazole-2-thione.

27. The process of claim 23 wherein the stream of the aqueous plating solution is directed onto the substrate metal surface as a spray of the solution.

28. The process of claim 23 wherein the stream of the aqueous plating solution is directed onto the substrate metal surface as a cascade of the solution.

29. A process for immersion plating a substrate metal surface with an other metal comprising the steps:
(a) providing a reservoir of aqueous plating solution comprising;
(i) a metal ion of a free metal, wherein the free metal is different from the metal of the substrate surface;
(ii) a complexing agent which is a 1,3-dialkylimidazole-2-thione compound of the formula:

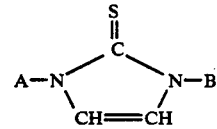

wherein A and B each individually is an alkyl or cycloalkyl group containing one to six carbon atoms; and
(iii) an acid;
(b) immersing the substrate metal surface into the aqueous plating solution; whereby a portion of the metal ions of the free metal (i) are reduced to free metal, wherein said reduced free metal displaces surface substrate metal which is oxidized to an ion and complexed with the complexing agent to form a substrate metal ion complex dissolved in the reacted aqueous plating solution at the surface of the substrate metal;
(c) removing the plated substrate metal surface from the the plating solution reservoir; and
(d) removing excess plating solution from the plated substrate metal surface thereby terminating the displacement plating process.

30. The immersion plating process of claim 29 wherein the aqueous plating solution is maintained under an inert atmosphere which is substantially free of oxygen.

31. The immersion plating process of claim 29 wherein the aqueous plating solution contains therein a free metal (iv) which is the free metal of the metal ions (i).

* * * * *